United States Patent [19]

Lippmann et al.

[11] Patent Number: 4,586,105
[45] Date of Patent: Apr. 29, 1986

[54] HIGH VOLTAGE PROTECTION DEVICE WITH A TAPE COVERED SPARK GAP

[75] Inventors: Raymond Lippmann, Ann Arbor; James R. Chintyan, Davison, both of Mich.

[73] Assignee: General Motors Corporation, Detroit, Mich.

[21] Appl. No.: 761,799

[22] Filed: Aug. 2, 1985

[51] Int. Cl.⁴ .............................................. H02H 9/06
[52] U.S. Cl. .................................... 361/117; 361/414; 313/325
[58] Field of Search ................. 361/91, 110, 111, 117, 361/414; 313/325, 351

[56] References Cited

U.S. PATENT DOCUMENTS 3,676,742 7/1972 Russell et al. ...................... 361/117
4,472,876 9/1984 Nelson ............................... 361/414
4,520,228 5/1985 Hoffman ............................ 361/414

*Primary Examiner*—A. D. Pellinen
*Assistant Examiner*—Jeffrey A. Gaffin
*Attorney, Agent, or Firm*—Warren D. Hill

[57] ABSTRACT

To protect a load circuit on a printed circuit board, a pair of input circuit conductors are placed close together to form a spark gap. A load limiting resistor is placed in one of the conductors. A tape with adhesive around its perimeter is secured to the circuit board over the spark gap to trap air or other gas at the spark gap. A conformal coating covers the circuit board including the tape and the resistor.

4 Claims, 4 Drawing Figures

HIGH VOLTAGE PROTECTION DEVICE WITH A TAPE COVERED SPARK GAP

FIELD OF THE INVENTION

This invention relates to a high voltage transient protection device and particularly to such a device on a printed circuit board.

BACKGROUND OF THE INVENTION

High voltage transients such as those caused by electrostatic discharge can have adverse effects on electrical circuitry. For example, the high voltages may break down dielectrics causing arcing between various portions of circuits. Passive components can fail in a variety of ways. The high voltage arcing may locally destroy dielectrics within capacitors causing them to develop low series resistance or they may vaporize or fuse materials used to fabricate resistors. The energies, currents and voltages associated with electrostatic discharge events may cause semiconductors to fail. Sufficient energies are present to melt bonding wires and local areas of thin semiconductor material. These and other events cause semiconductors to fail or to behave abnormally.

The detrimental effects of electrostatic discharge events are accentuated as circuit densities are increased and as parts are miniaturized. Then distances between the conductors decrease so that as electrical field intensity increases the ability of materials to behave as insulators is reduced. Moreover the energy dissipated by a discharge is absorbed by a smaller device thereby creating a greater temperature rise than in the case of a large device. While earlier concerns were to limit transients to several thousand volts it is now important to limit transients to relatively low values, say, a few hundred volts.

To overcome these difficulties it is known to protect semiconductors and other circuits by limiting currents with resistors while providing alternative discharge mechanisms and paths. Specifically, it has been proposed to incorporate a spark gap between adjacent conductive paths on a printed circuit board to discharge high voltages at the input terminals of circuit devices to avoid the destructive dissipation of energy at sensitive portions of the circuit. In such devices, however, it is desired that the transient voltages be controlled to a low level and that the discharge voltage be consistent over a period of time and stable in adverse operating environments. It is also desired that any current limiting resistor be protected so that it does not become bypassed or damaged. It is a further requirement that the protective device not be destroyed or debilitated by a transient high voltage but rather it should remain operative to maintain circuit protection even after repeated applications of high voltage transients. It is known to cover spark gaps with a dielectric coating, however, this presents two problems; first the breakdown potential of the spark gap is greatly increased as compared to the breakdown potential in air and moreover it can be expected that the dielectric would be destroyed at least in part by a single discharge so that its effectiveness would be reduced or lost.

SUMMARY OF THE INVENTION

It is, therefore, an object of the invention to provide a high voltage transient protection device effective to discharge transients at relatively low voltages and which is consistent in operation over time and under a variety of ambient conditions. It is a further object of the invention to provide such a device on a printed circuit board covered with a conformal coating.

The invention is carried out by providing on a printed circuit board having a dielectric substrate at least a pair of circuit conductors closely spaced to define a spark gap for discharging high voltages, and an adhesive tape on the circuit board overlying the spark gap and trapping gas at the spark gap. The invention is further carried out by providing a spark gap as described with a current limiting resistor in at least one of the circuit paths and a conformal coating covering the printed circuit board including the tape and the resistor.

BRIEF DESCRIPTION OF THE DRAWINGS

The above and other advantages of the invention will become more apparent from the following description taken in conjunction with the accompanying drawings wherein like reference numerals refer to like parts and wherein.

DESCRIPTION OF THE PREFERRED EMBODIMENTS

Figure 1:
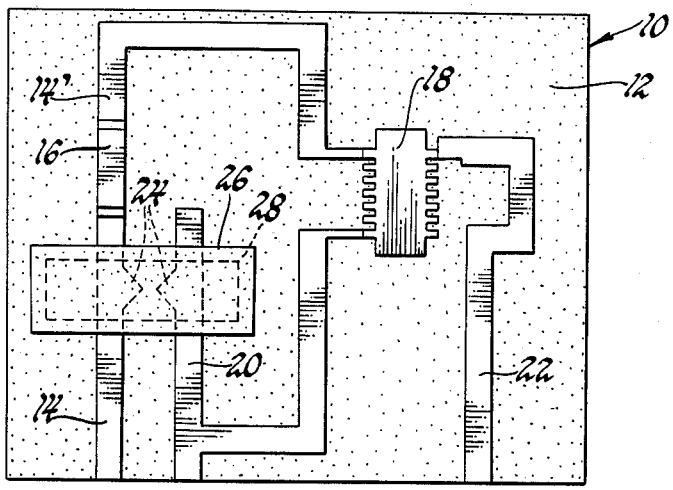
FIG. 1 a diagrammatic top view of a circuit board incorporating a protective device according to the invention with conformal coating removed for clarity.
Figure 2:
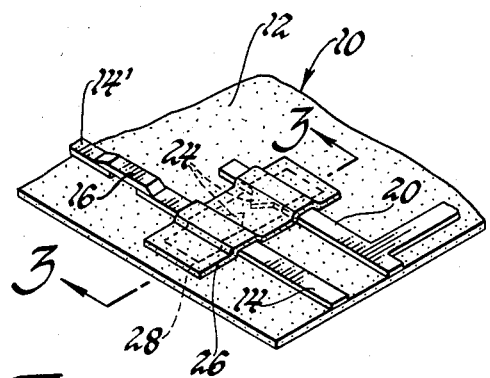
FIG. 2 is an isometric view of a portion of the circuit board of FIG. 1 illustrating the protective device according to the invention.
Figure 3:
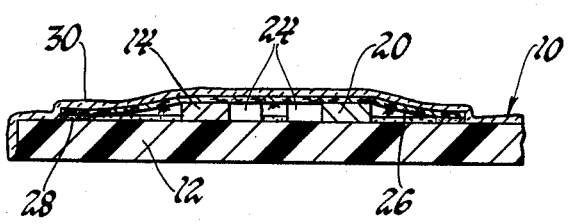
FIG. 3 is a cross sectional view of the circuit board taken along lines 3—3 of FIG. 2 but including a conformal coating.

As shown in FIGS. 1, 2 and 3, a printed circuit board 10 comprises a substrate 12 having a first conductive path having portions 14 and 14' which portions are spaced to accommodate a resistor chip 16 which is soldered to the ends of the path portions. The path 14 and 14' forms the signal input to a semiconductor circuit package 18 which may, for example, be a CMOS device. A second conductive path 20 has a branch extending parallel to the path 14 and a branch extending to the semiconductor device 18 and serves as a ground conductor. A third conductive path 22 is coupled to the device 18 to supply power thereto. The paths 14 and 20 each have at one side a point or electrode 24 projecting toward the other point to define a spark gap. In the interest of achieving a dielectric breakdown at a low voltage the gap is made as small as possible consistent with the practical manufacture of printed circuit boards. In practice, a spacing of 0.015 inches between the discharge points 24 was found to be practical since it is easily fabricated and discharges occurred in air at voltage levels not exceeding 200 volts. Point radii of 0.0025 to 0.0075 inches were tried and only minor variations in discharge voltage were observed.

To maintain a controlled atmosphere at the spark gap and to exclude conformal coating material from the gap a tape 26 is secured to the circuit board 10 over the region of the points 24, the tape holding a minute bubble of air or a trace of air in the spark gap. The tape may be covered with adhesive on one side so long as the adhesive does not intrude into the spark gap. Even if the tape adheres to the top of the electrodes 24 an air gap is maintained if the conductive paths are sufficiently raised above the substrate surface. Preferably, however, the tape 26 contains a coating of adhesive 28 around its perimeter or border which secures the tape to the circuit board to define a protected region between the tape and the substrate 12. A conformal coating 30, as shown in FIG. 3, is applied over one or both surfaces of the circuit board to protect the circuitry from moisture or other contaminants which might affect its operation. A number of suitable conformal coating materials are commercially available, e.g. Dow Corning QI 2620. The coating 30 increases the dielectric constant between adjacent conductors and thus is very important, especially for very close conductor spacings. In addition the coating improves the isolation of the conductor path portions 14 and 14' to prevent arcing around the resistor 16. Thus any discharge is effectively steered to the discharge gap between the points 24. The conformal coating 30 also hermetically seals the tape so that any air beneath the tape is permanently contained. In the manufacture of the circuit board, the board is heated in a dry atmosphere to drive out moisture before the tape 26 is applied. The atmosphere is preferably air but other gases may be used if desired. The conformal coating, of course, is applied after the tape 26 is secured to the substrate.

Figure 4:
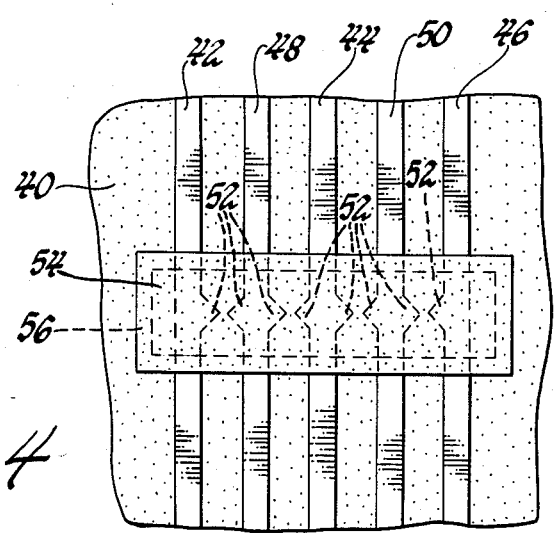
FIG. 4 is a top view of a printed circuit board incorporating an array of protective devices according to the invention.

FIG. 4 illustrates a second embodiment of the invention incorporating many spark gaps on a single circuit board and covered with a single piece of tape. A circuit board 40 has three separate signal carrying conductors 42, 44 and 46 arranged parallel to one another and separated by a pair of grounded conductors 48 and 50. Each of the conductors has one or two points 52 directed toward neighboring conductors to form small spark gaps therebetween as in FIG. 1. A single tape 54 with an adhesive border 56 must span the entire array of spark gaps to form an air space around the spark gaps. This arrangement allows a number of circuits on the same circuit board to be provided with high voltage protection. Preferably a conformal coating is applied to this device as described previously.

Conveniently the tape 26 or 54 serves a second function that of carrying an identifying code or number such as a date or serial number which is a necessary part of the circuit package. The conformal coating must be sufficiently translucent to permit legibility of the identification. Thus the tape, which is an inexpensive component of the circuit, serves two necessary functions.

It will thus be seen that according to this invention an inexpensive circuit structure is provided for limiting voltage transients to a few hundred volts thereby preventing circuit damage, the device being operative for repetitive high voltage transient inputs.

The embodiments of the invention in which an exclusive property or privilege is claimed are defined as follows:

1. A high voltage transient protection device on a printed circuit board comprising:
   a dielectric substrate,
   at least a pair of closely spaced circuit conductors on the substrate defining a spark gap for discharging high voltage, and
   a tape secured to the printed circuit board overlying the spark gap for trapping gas in the spark gap.

2. A device as defined in claim 1 wherein the tape is formed with a coating of adhesive around its border for securing the tape to the printed circuit board with the center of the tape spaced from the substrate in the region of the spark gap.

3. A high voltage transient protection device on a printed circuit board comprising:
   a dielectric substrate,
   at least a pair of adjacent circuit paths on the substrate coupled to a load to be protected,
   a resistor in one of the circuit paths for limiting current to the load,
   closely spaced conductors on the circuit paths defining a predetermined spark gap for discharging high voltage across the circuit paths,
   an adhesive tape on the printed circuit board overlying the spark gap and trapping gas in the spark gap, and
   a conformal coating covering the circuit board including the resistor and the tape, whereby the conformal coating prevents discharge across the resistor, and the tape excludes the conformal coating material from the spark gap.

4. A device as defined in claim 3 wherein several circuit paths form spark gaps between adjacent pairs of circuit paths, the spark gaps being closely grouped, and the tape covers all the spark gaps.

* * * * *